(12) United States Patent
Tian et al.

(10) Patent No.: US 10,810,921 B2
(45) Date of Patent: Oct. 20, 2020

(54) GOA CIRCUIT, METHOD FOR DRIVING THE SAME AND DISPLAY PANEL

(71) Applicants: BOE TECHNOLOGY GROUP CO., LTD., Beijing (CN); Chongqing BOE Optoelectronics Technology Co., Ltd., Chongqing (CN)

(72) Inventors: Zhenguo Tian, Beijing (CN); Zhihui Wang, Beijing (CN); Shuai Chen, Beijing (CN); Shuang Hu, Beijing (CN); Lijun Xiong, Beijing (CN); Xing Dong, Beijing (CN); Xiuzhu Tang, Beijing (CN); Zhi Zhang, Beijing (CN); Taoliang Tang, Beijing (CN); Jingpeng Zhao, Beijing (CN)

(73) Assignees: BOE TECHNOLOGY GROUP CO., LTD., Beijing (CN); Chongqing BOE Optoelectronics Technology Co., Ltd., Chongqing (CN)

(*) Notice: Subject to any disclaimer, the term of this patent is extended or adjusted under 35 U.S.C. 154(b) by 30 days.

(21) Appl. No.: 16/039,209

(22) Filed: Jul. 18, 2018

(65) Prior Publication Data
US 2019/0206293 A1 Jul. 4, 2019

(30) Foreign Application Priority Data
Jan. 2, 2018 (CN) .......................... 2018 1 0002723

(51) Int. Cl.
*G09G 3/36* (2006.01)
*G09G 3/20* (2006.01)
(Continued)

(52) U.S. Cl.
CPC ............. *G09G 3/20* (2013.01); *G06F 3/0412* (2013.01); *G06F 3/04166* (2019.05);
(Continued)

(58) Field of Classification Search
CPC ............. G09G 3/20; G09G 2310/0267; G09G 2310/0286; G09G 2310/08;
(Continued)

(56) References Cited

U.S. PATENT DOCUMENTS

| 2016/0307641 A1* | 10/2016 | Zheng | ................... G09G 3/3677 |
| 2016/0358586 A1* | 12/2016 | Song | ........................ G09G 3/20 |
| 2016/0379586 A1* | 12/2016 | Wu | ......................... G06F 3/044 |
| | | | 345/174 |

FOREIGN PATENT DOCUMENTS

| CN | 104700795 | 6/2015 |
| CN | 105047168 | 11/2015 |

(Continued)

OTHER PUBLICATIONS

1st Office Action dated Jul. 16, 2020 for Chinese Patent Application No. 201810002723.3.

*Primary Examiner* — Jennifer T Nguyen
(74) *Attorney, Agent, or Firm* — Foley & Lardner LLP

(57) ABSTRACT

The present disclosure provides a GOA circuit, a method for driving the GOA circuit, and a display panel. The GOA circuit includes a plurality of GOA sub-circuits. Each GOA sub-circuit includes a plurality of cascaded shift register units. Each of the GOA sub-circuits is connected to an independent start signal terminal, and the start signals of different GOA sub-circuits are separated by a time interval for acquisition of touch signals.

6 Claims, 9 Drawing Sheets

(51) Int. Cl.
*G11C 19/28* (2006.01)
*G06F 3/041* (2006.01)

(52) U.S. Cl.
CPC .......... *G06F 3/04182* (2019.05); *G11C 19/28* (2013.01); *G11C 19/287* (2013.01); *G09G 2310/0267* (2013.01); *G09G 2310/0286* (2013.01); *G09G 2310/08* (2013.01); *G09G 2354/00* (2013.01)

(58) Field of Classification Search
CPC ............. G06F 3/04166; G06F 3/04182; G06F 3/0412; G11C 19/28; G11C 19/287
USPC ........................................ 345/100, 204, 205
See application file for complete search history.

(56) References Cited

FOREIGN PATENT DOCUMENTS

| | | |
|---|---|---|
| CN | 105630234 | 6/2016 |
| CN | 105702196 | 6/2016 |
| CN | 107256701 | 10/2017 |

\* cited by examiner

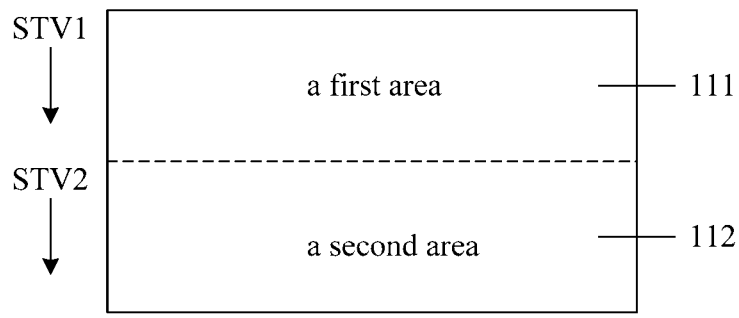

Fig. 11

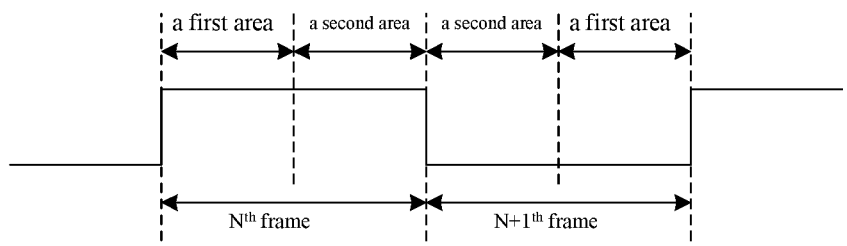

Fig. 12

| Providing a first start signal (STV1) to the first shift register module, such that a plurality of cascaded shift register units 400 in the first shift register module sequentially output a plurality of rows of the scan signals | ⟵ S1 |

| Providing a second start signal (STV2) to the second shift register module, such that a plurality of cascaded shift register units 400 in the second shift register module sequentially output a plurality of rows of the scan signals | ⟵ S2 |

Fig. 13

GOA CIRCUIT, METHOD FOR DRIVING THE SAME AND DISPLAY PANEL

CROSS REFERENCE

This application is based upon and claims priority to Chinese Patent Application No. 201810002723.3, filed on Jan. 2, 2018, the entire contents thereof are incorporated herein by reference.

TECHNICAL FIELD

The present disclosure relates to a display technology field, and in particular, to a GOA circuit, a method for driving the GOA circuit, and a display panel.

BACKGROUND

In recent years, display devices have exhibited a trend toward high integration and low cost. The GOA (Gate Driver on Array) as a representative is used to integrate the GOA circuit into the peripheral area of an array substrate, which may achieve designing of a narrow frame, and also may effectively improve the integration of the display device and reduce cost for manufacturing the display device.

Among numerous touch technologies, an In Cell touch technology has been widely used in high-end display products due to its advantages of low cost, high sensitivity, and easy thinning of the panel. At present, combination of the In Cell touch technology and the GOA panel has been successfully applied in mobile touch products. The GOA panel has a refresh frequency of mostly 60 HZ, and the screen of the mobile touch product is small so that a customer's needs may be satisfied when a touch signal has a report rate of 60/s. As shown in FIG. 1, a method of driving a mobile touch product is described as follows: a period from finishing of one frame screen scanning to beginning of the other frame screen scanning is set as a touch time period, and other periods are set as a display time period; a common electrode provides a common electrode signal (Vcom) which is output as a DC signal during the display time period, while the common electrode is further used as a touch electrode for providing a touch signal (Tx) which is output as a pulse signal during the touch time period. In this mode, one frame of display image corresponds to one frame of touch data report point, so that the report rate of the touch signal is equal to the refresh frequency of the display panel. However, for the touch products with larger size, such as notebook computers, the report rate should be higher than 100/s, and the GOA panel with an image refresh frequency of 60 Hz has no longer meet the needs of the touch function, which restrict using the In Cell touch technology with larger size products in the GOA panels with narrow frame.

It should be noted that the information as disclosed in the Background merely serves to enhance understanding of the background of the present disclosure, and thereby may include information that does not constitute the related art that has been known to those skilled in the art.

SUMMARY

According to one exemplary arrangement of the present disclosure, a GOA circuit includes a plurality of GOA sub-circuits. Each of the GOA sub-circuits includes a plurality of cascaded shift register units. Each of the GOA sub-circuits is connected to an independent start signal terminal. The start signals of different GOA sub-circuits are separated by a time interval for acquisition of touch signals.

In one exemplary arrangement of the present disclosure, each GOA sub-circuit further includes a plurality of cascaded dummy shift register units connected to ends of the plurality of cascaded shift register units. Dummy shift register units are configured to provide a reset signal for several shift register units at the end of the GOA sub-circuits.

In one exemplary arrangement of the present disclosure, the GOA circuit further includes a plurality of clock signal terminals and a number of the dummy shift register units is equal to one-half of number of the clock signal terminals.

In one exemplary arrangement of the present disclosure, the GOA circuit further includes a noise cancelling control signal terminal, and the noise cancelling control signal terminal is configured to output a noise cancelling control signal at a touch phase such that each of the shift register units outputs a preset signal generated by the clock signal terminal. The preset signal has the same waveform with the touch signal and a data signal.

In one exemplary arrangement of the present disclosure, the shift register unit includes an input module that is connected to an input signal terminal, a first power signal terminal and a pull-up node. The input module is configured to transmit the first power signal to the pull-up node in response to the input signal, a reset module that is connected to a reset signal terminal, a second power signal terminal, and the pull-up node, and is configured to transmit the second power signal to the pull-up node in response to the reset signal, a noise cancelling control module that is connected to the noise cancelling control signal terminal and the pull-up node, and is configured to transmit the noise cancelling control signal to the pull-up node in response to the noise cancelling control signal, an output module that is connected to the clock signal terminal, the pull-up node, and a signal output terminal, and is configured to transmit a clock signal to the signal output terminal in response to a voltage signal of the pull-up node, a pull-down control module that is connected to the first power signal terminal, the pull-up node, the second power signal terminal, and a pull-down node, and is configured to transmit the first power signal to the pull-down node in response to the first power signal, and transmit the second power signal to the pull-down node in response to the voltage signal of the pull-up node, and a pull-down module that is connected to the pull-down node, the second power signal terminal, the pull-up node, and the signal output terminal, and is configured to transmit the second power signal to the pull-up node and the signal output terminal in response to the voltage signal of the pull-down node.

In one exemplary arrangement of the present disclosure, the GOA circuit is further connected to a timing controller, and is configured to acquire signal variation of adjacent two frame screens corresponding to the respective GOA sub-circuits detected by the timing controller. The start signals corresponding to the respective GOA sub-circuits are sequentially output in the next frame according to a degree of the signal variation.

According to one exemplary arrangement of the present disclosure, there is provided with a gate driving method for driving the aforesaid GOA circuit. The driving method including: providing an independent start signal to each of GOA sub-circuits in turn such that a plurality of cascaded shift register units in each of the GOA sub-circuits sequentially output a plurality of rows of scan signals. The start signals of different GOA sub-circuits are separated by a time interval for acquisition of touch signals.

In one exemplary arrangement of the present disclosure, when the GOA circuit further includes a noise cancelling control signal terminal, the driving method further includes: in a touch phase, outputting a noise cancelling control signal to all shift register units such that each of the shift register units outputs a preset signal generated by the clock signal terminal. The preset signal has the same waveform with the touch signal and a data signal.

In one exemplary arrangement of the present disclosure, the driving method further includes acquiring signal variation of adjacent two frame screens corresponding to the respective GOA sub-circuits detected by the timing controller, and sequentially outputting the first start signal and the second start signal in the next frame according to degree of the signal variation.

According to one exemplary arrangement of the present disclosure, a display panel includes the GOA circuit as described above.

It should be understood that both foregoing general description and following detailed description are merely exemplary and explanatory but are not limited to the present disclosures.

BRIEF DESCRIPTION OF THE DRAWINGS

The accompanying drawings, which are incorporated in and constitute a part of the present description, illustrate arrangements of the present disclosure and together with the description serve to explain the principle of the present disclosure. Obviously, the drawings in the following description are provided to merely illustrate some of the arrangements of the present disclosure. For those ordinary skilled in the art, other drawings may also be obtained according to these drawings without any creative work.

FIG. 11 is a schematic view showing a scanning manner of a display screen in an exemplary arrangement of the present disclosure;

FIG. 12 is schematic view showing a response time of a display screen in an exemplary arrangement of the present disclosure; and FIG. 13 is a flowchart showing a gate driving method in an exemplary arrangement of the present disclosure.

DETAILED DESCRIPTION

Figure 1:
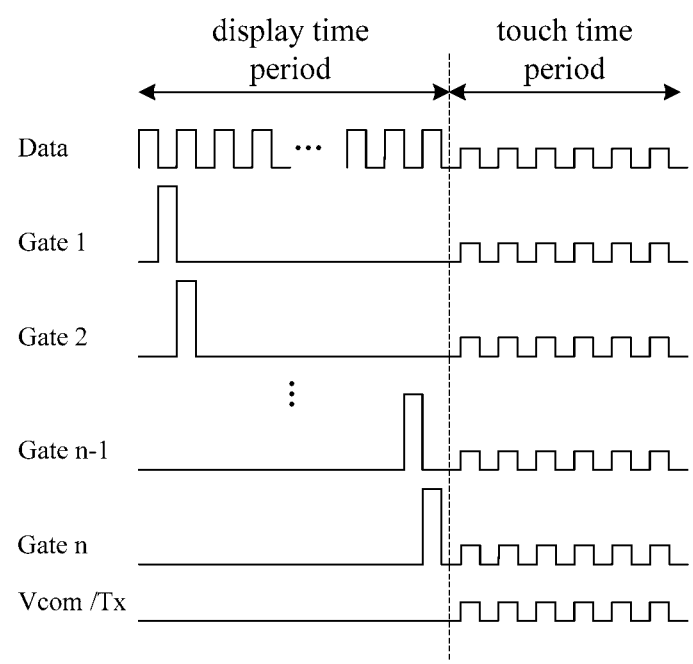
FIG. 1 is a schematic timing diagram of driving a touch product in the related art.

Now, the exemplary arrangements will be described more fully with reference to the accompany drawings. However, the exemplary arrangements can be implemented in various forms and should not be construed as limited to the arrangements set forth herein. Instead, these arrangements are provided so that this disclosure will be thorough and complete, and the concept of the exemplary arrangement will fully conveyed to those skilled in the art. The features, structures, or characteristics as above described may be combined into one or more arrangements in any suitable manner. In the following description, numerous details are provided to help fully understanding arrangements of the present disclosure. However, it will be aware for those skilled in the art that the technical solutions of the present disclosure may be achieved by omitting one or more specific details, or by means of other methods, components, devices, steps, etc. In other cases, well-known technologies will not be shown or described in detail to avoid obscuring the present disclosure.

In addition, the accompanying figures of the present disclosure are only illustrative, but not necessarily to scale. Thickness and shape of the various layers in the drawings do not reflect the true proportions and are merely for the purpose of illustrating the present disclosure. The same reference numbers in the drawings denote the same or similar parts, and thereby being omitted.

Figure 2:
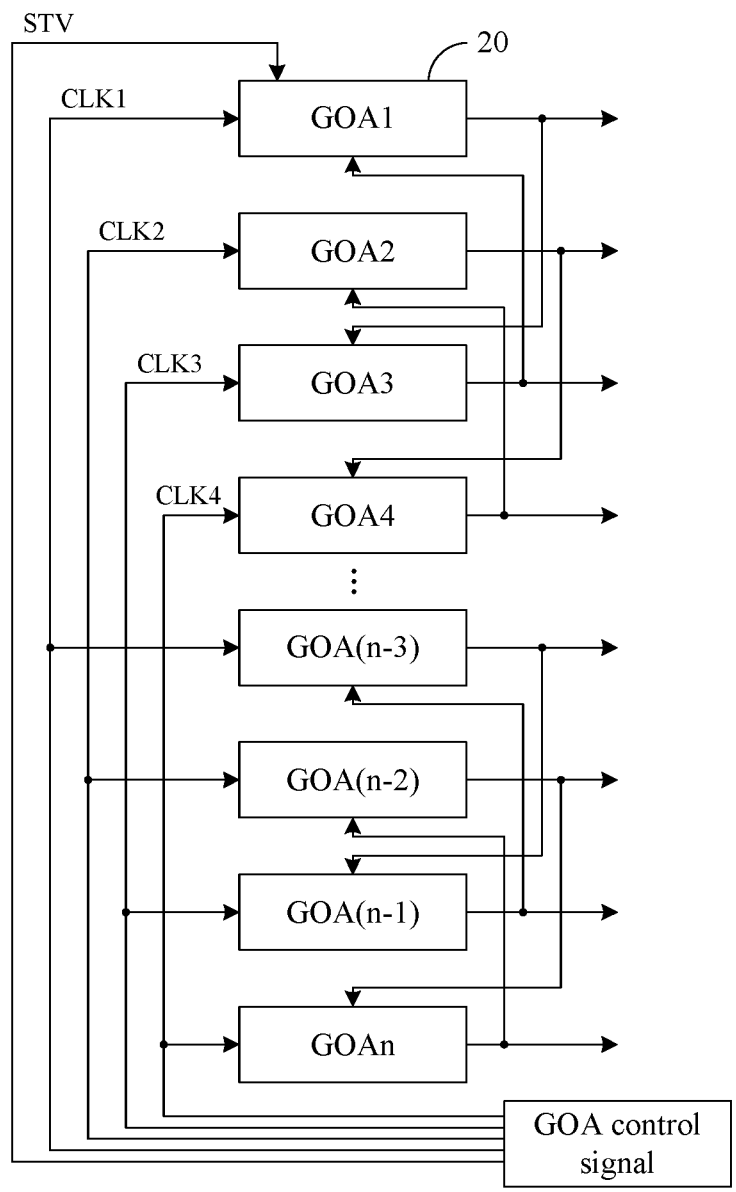
FIG. 2 is a schematic cascade structure view showing a GOA circuit in the related art.
Figure 3:
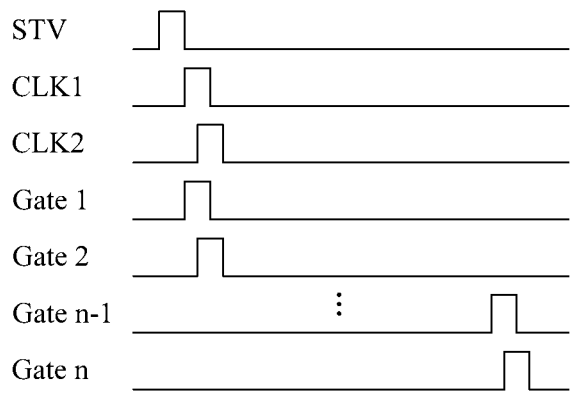
FIG. 3 is a schematic timing diagram showing output signals of a GOA circuit in the related art.

FIG. 2 is a cascade structure view of a conventional GOA circuit. Since a cascade relationship between the GOA units 20 is a simple input/reset relationship, for example, an output signal of a previous-stage GOA unit 20 is used as an input signal of an inferior-stage GOA unit 20, and an output signal of the inferior-stage GOA unit 20 is used as a reset signal of the previous-stage GOA unit 20, thereby an output waveform of the GOA circuit is only presented as a progressive shift output waveform as shown in FIG. 3. Based on this, the touch function is achieved by interposing touch signals in an interval time between the frames, which restricts the touch report rate of the GOA panel to merely be equal to its refresh frequency which is usually at 100 Hz or less, so as to restrict using the In Cell touch technology with a larger size product in the GOA panel with a narrow frame.

Figure 4:
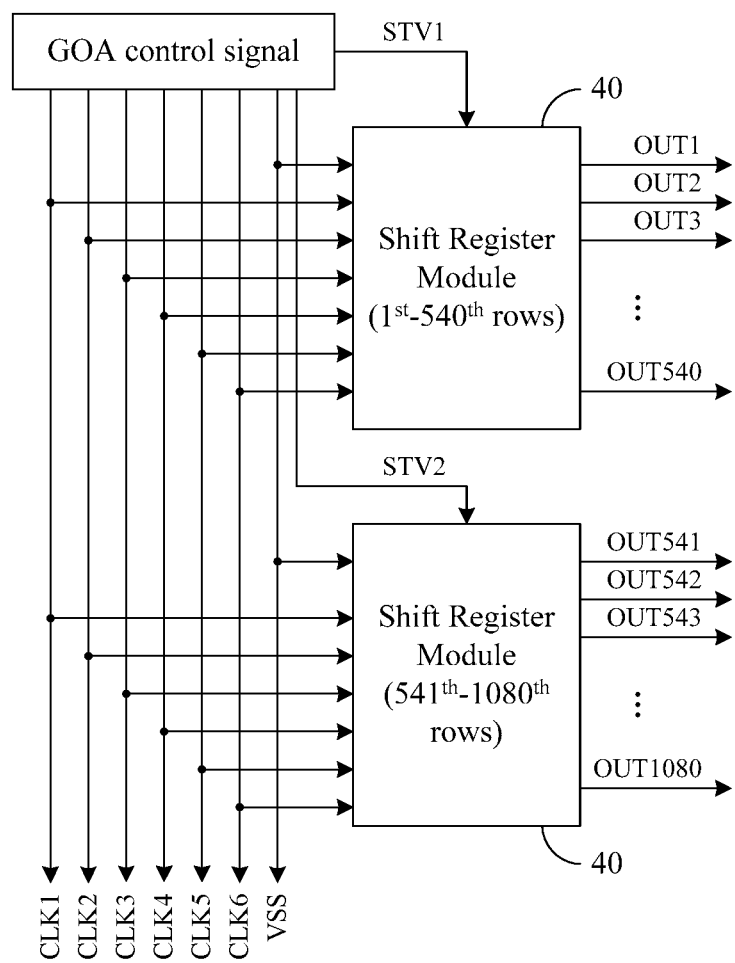
FIG. 4 is a block control diagram of the GOA circuit in one exemplary arrangement of the present disclosure.
Figure 5:
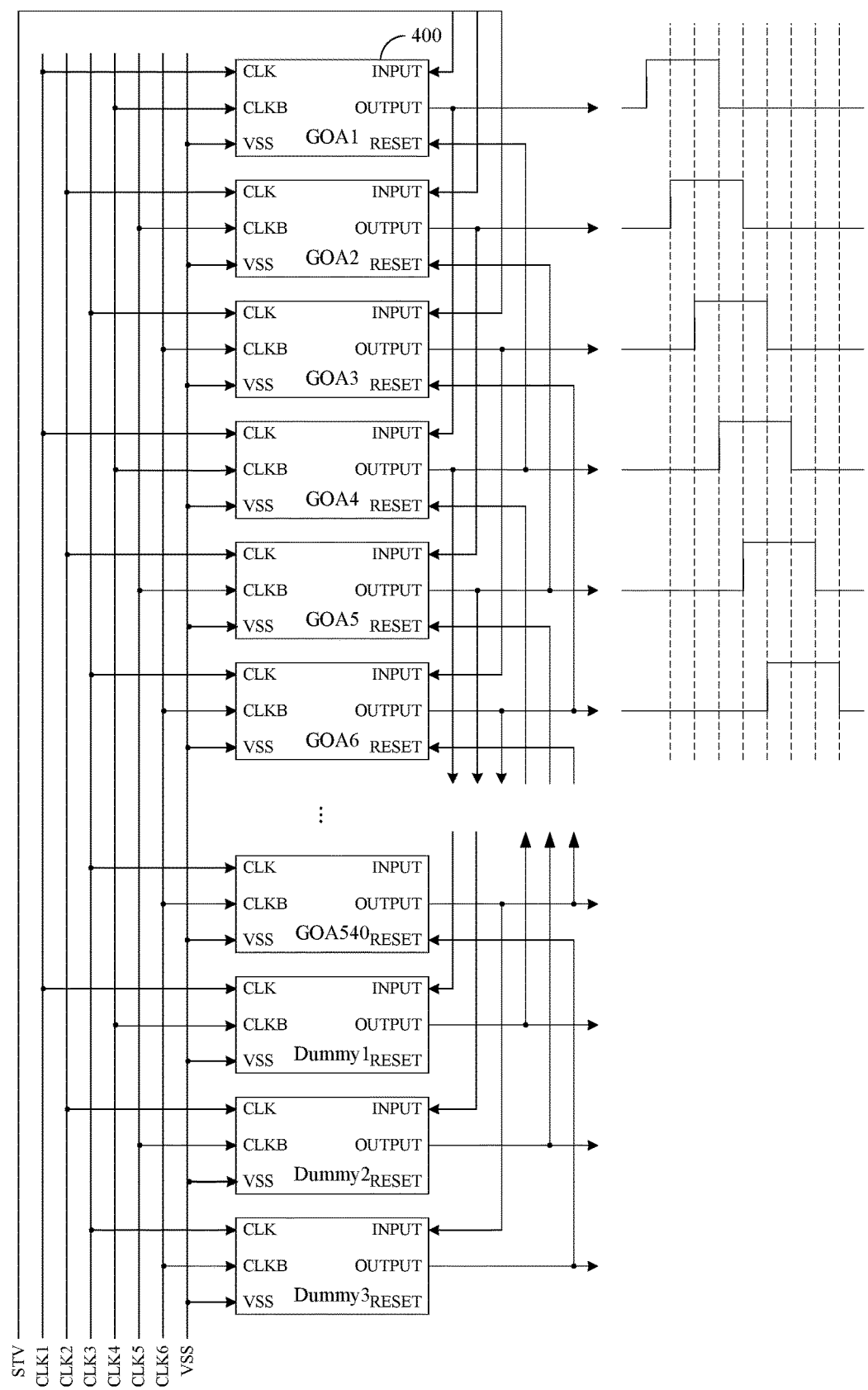
FIG. 5 is a schematic cascade structure view of the GOA circuit in one exemplary arrangement of the present disclosure.

An implementation of the present disclosure provides a GOA circuit that may use a GOA circuit to perform block driving. As shown in FIG. 4 and FIG. 5, the GOA circuit may include a plurality of GOA sub-circuits 40. The GOA sub-circuit 40 may include a plurality of cascaded shift register units 400. All shift register units 400 in all GOA sub-circuits 40 are together used to complete scanning of one frame screen.

Each of the GOA sub-circuits 40 is connected to an independent start signal terminal STV. The start signals of different GOA sub-circuits 40 are separated by a time interval as a touch control time period, for acquiring the touch signals. Here, the time interval may be predetermined.

Referring to FIG. 4, as an example, the GOA circuit includes two GOA sub-circuits 40. The first start signal (STV1) of the first GOA sub-circuit 40 and the second start signal (STV2) of the second GOA sub-circuit 40 are separated by a time interval. The second start signal (STV2) of the second GOA sub-circuit 40 and the first start signal (STV1) of the first GOA sub-circuit 40 are also separated by a time interval, so that the touch signals are acquired during each of the time periods separated between the different GOA sub-circuits 40, that is, there are a plurality of touch signal acquisitions interposed in a frame screen scanning process, so that the report rate of the touch signal is greater than the refresh frequency of the GOA circuit.

It should be noted that the number of the GOA sub-circuits 40 and the number of shift register units 400 in each of the GOA sub-circuits 40 are not limited in this arrangement, and may be designed according to actual resolution of the GOA panel, for example, FHD (Full High Definition) product with a resolution of 1920×1080 may include two GOA sub-circuits 40, and each of the GOA sub-circuits 40 includes 540 shift register units 400, which may meet the needs of large-size GOA touch panels.

The GOA circuit provided by the exemplary arrangement of the present disclosure is divided into a plurality of GOA sub-circuits 40, and each of the GOA sub-circuits 40 is controlled by using an independent start signal such that the output signals of the respective GOA sub-circuits 40 are separated by a certain time period, and acquisition of the touch signal is performed in respective separated time period, in this case, the report rate of the touch signal may be significantly improved relative to the refresh frequency of the GOA circuit, so as to improve the response speed of the touch product.

In this arrangement, the GOA sub-circuit 40 may further include a plurality of cascaded dummy shift register units connected to the end of the plurality of cascaded shift register units 400. The dummy shift register units may be configured to provide reset signals for a number of shift register units 400 in the end of the GOA sub-circuit 40. The GOA circuit may further include a plurality of clock signal terminals CLK. And the number of the dummy shift register units may be equal to half of the number of clock signal terminals.

Referring to FIG. 5, as an example of a FHD product (with a resolution of 1920×1080) of 6 CLK, the GOA circuit includes two GOA sub-circuits 40. The first GOA sub-circuit 40 may include 540 shift register units 400, opening signals are provided by the first start signal (STV1) and are output to the $540^{th}$ output signal (OUT540) from the first output signal (OUT1) in a sequential cascade manner, and the first GOA sub-circuit 40 may be configured to output scan signals in the first to $540^{th}$ rows. The second GOA sub-circuit 40 may also include 540 shift register units 400, and the opening signals are provided by the second start signal (STV2) and are output to the $1080^{th}$ output signal (OUT1080) from the $541^{st}$ output signal (OUT541) in a sequential cascade manner, and the second GOA sub-circuit 40 may be configured to output the scan signals in the $541^{st}$ to $1080^{th}$ rows. There are three dummy shift register units in each of the GOA sub-circuit 40, which are configured to provide reset signals for the last three stages of the shift register unit 400 in the corresponding the GOA sub-circuit 40.

Figure 6:
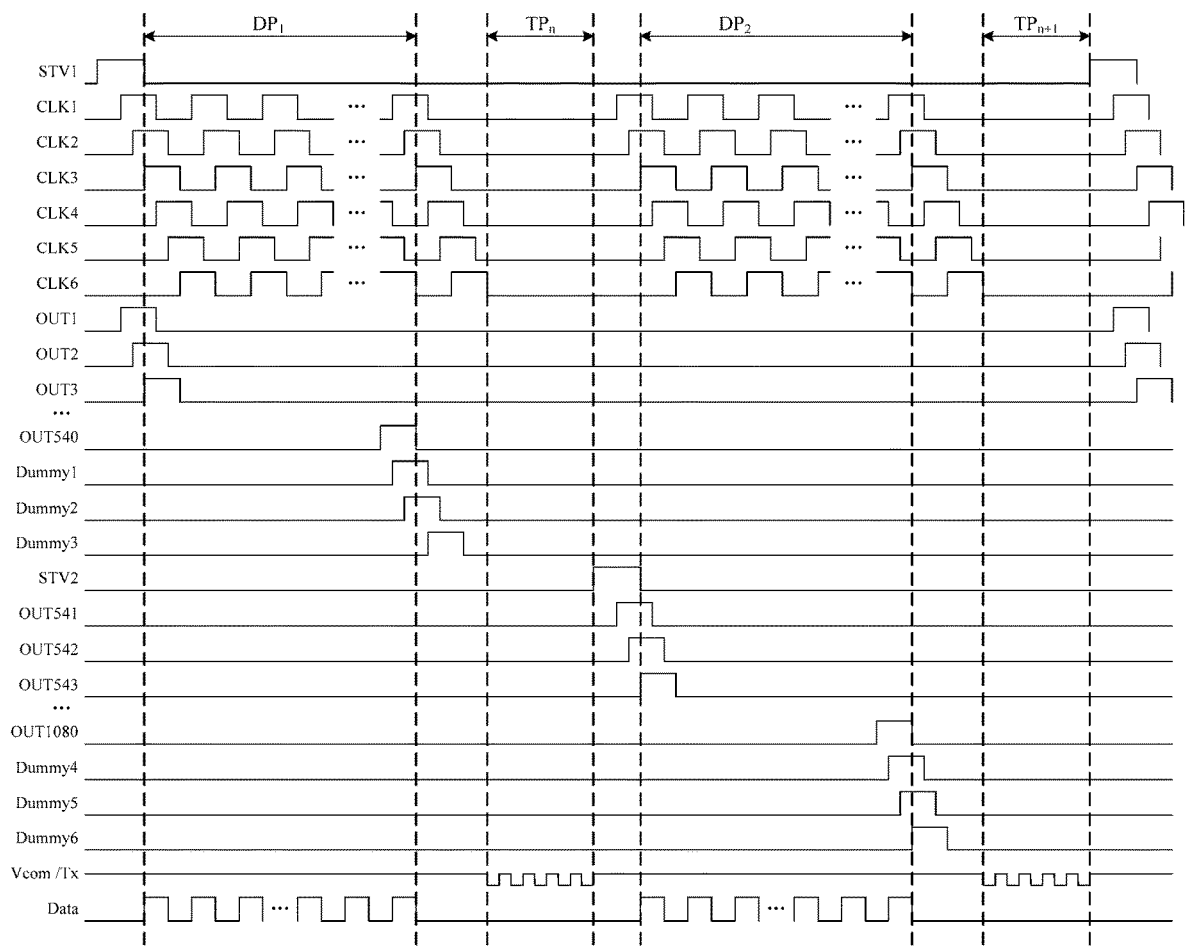
FIG. 6 is a signal timing diagram of the GOA circuit in one exemplary arrangement of the present disclosure.

Based on this, one half display time $DP_1$, a $N^{th}$ touch time $TP_n$, the other half display time $DP_2$, and a $N+1^{th}$ touch time $TP_{(n+1)}$ are included within one frame. FIG. 6 shows a waveform timing diagram of signals. A COM electrode serves as the common electrode in the display time period and the touch electrode in the touch time period, and has a dual function of providing a display voltage and capturing touch signals, so that the COM signal of the COM electrode may provide a DC signal during the display time period and a square wave signal during the touch time period. In this arrangement, since the touch signal is acquired twice within one frame, the report rate of the touch signal is twice of the refresh frequency of the displayer, but this arrangement is not limited thereto. If the GOA circuit is divided into three GOA sub-circuits 40 and controlled independently by a separate start signal, the report rate of the touch signal is three times of the refresh frequency of the displayer, and so forth.

Figure 7:
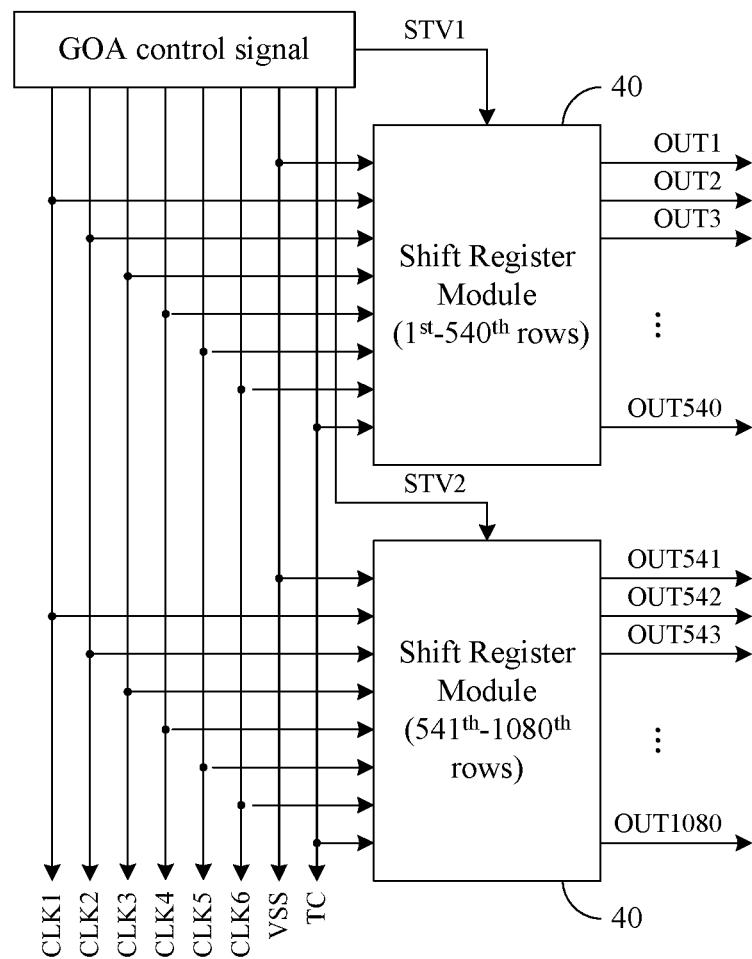
FIG. 7 is a block control diagram of the GOA circuit in another one exemplary arrangement of the present disclosure.
Figure 8:
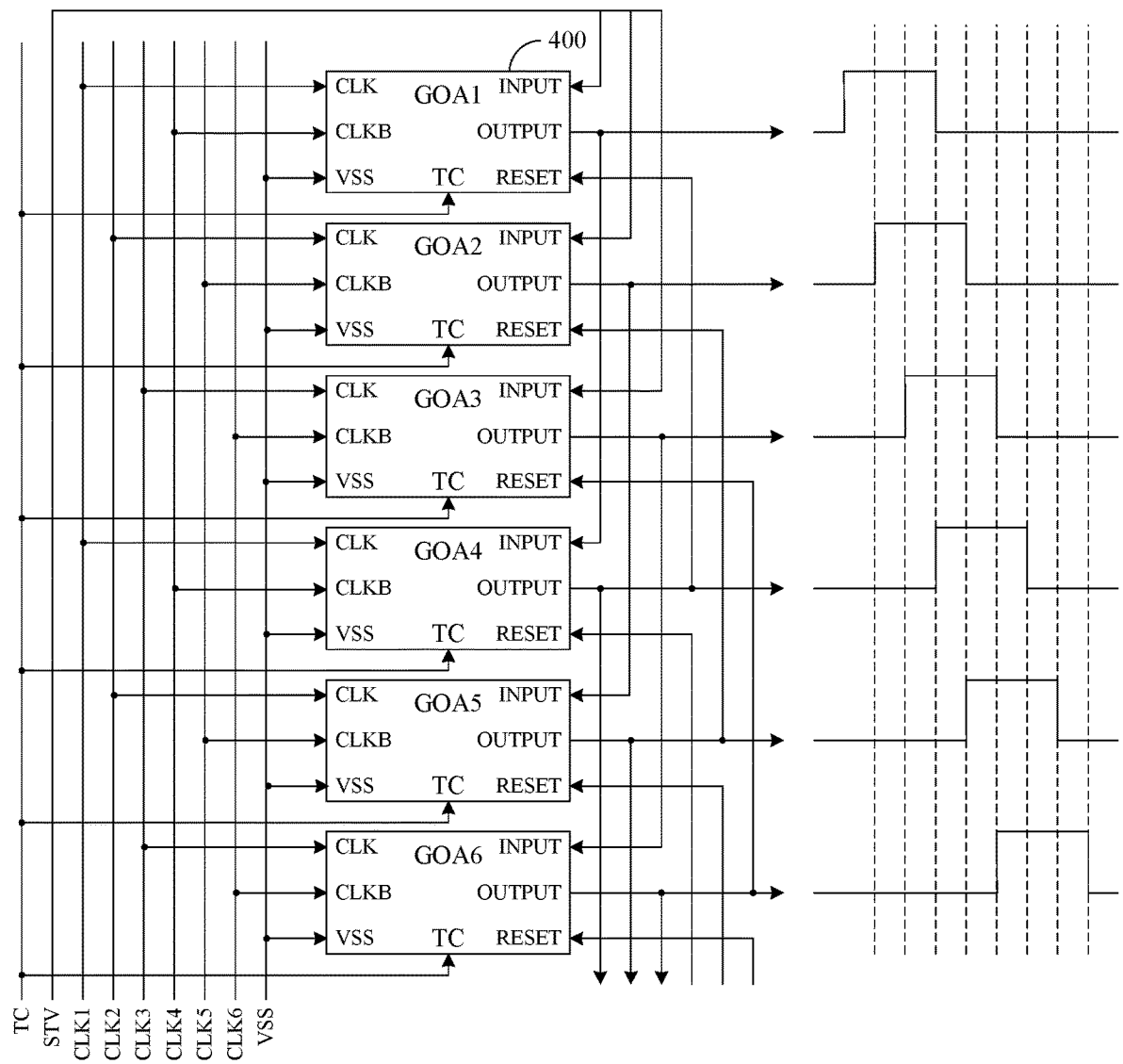
FIG. 8 is a schematic cascade structure view of the GOA circuit in another exemplary arrangement of the present disclosure.

In this arrangement, as shown in FIG. 7 and FIG. 8, the GOA circuit may further include a noise cancelling control signal terminal TC. The noise cancelling control signal terminal TC may be configured to output a noise cancelling control signal at a touch phase such that each shift register unit 400 outputs a preset signal generated by the clock signal terminal (CLK). The preset signal preferably has the same waveform with the touch signal and the data signal to reduce a pressure differential between the scan signal and the data signal and the touch signal, so as to reduce the noise of the touch signal.

Figure 9:
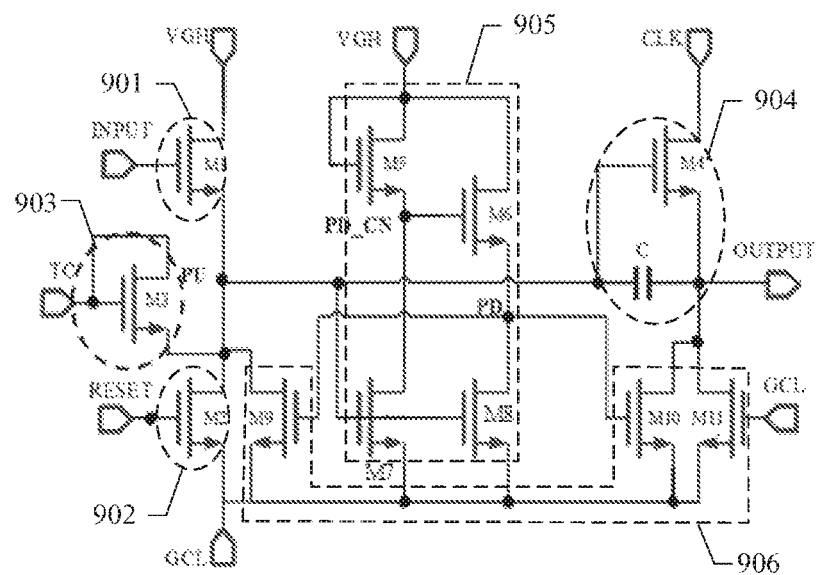
FIG. 9 is a schematic view showing a circuit structure of a shift register unit in another exemplary arrangement of the present disclosure.
Figure 10:
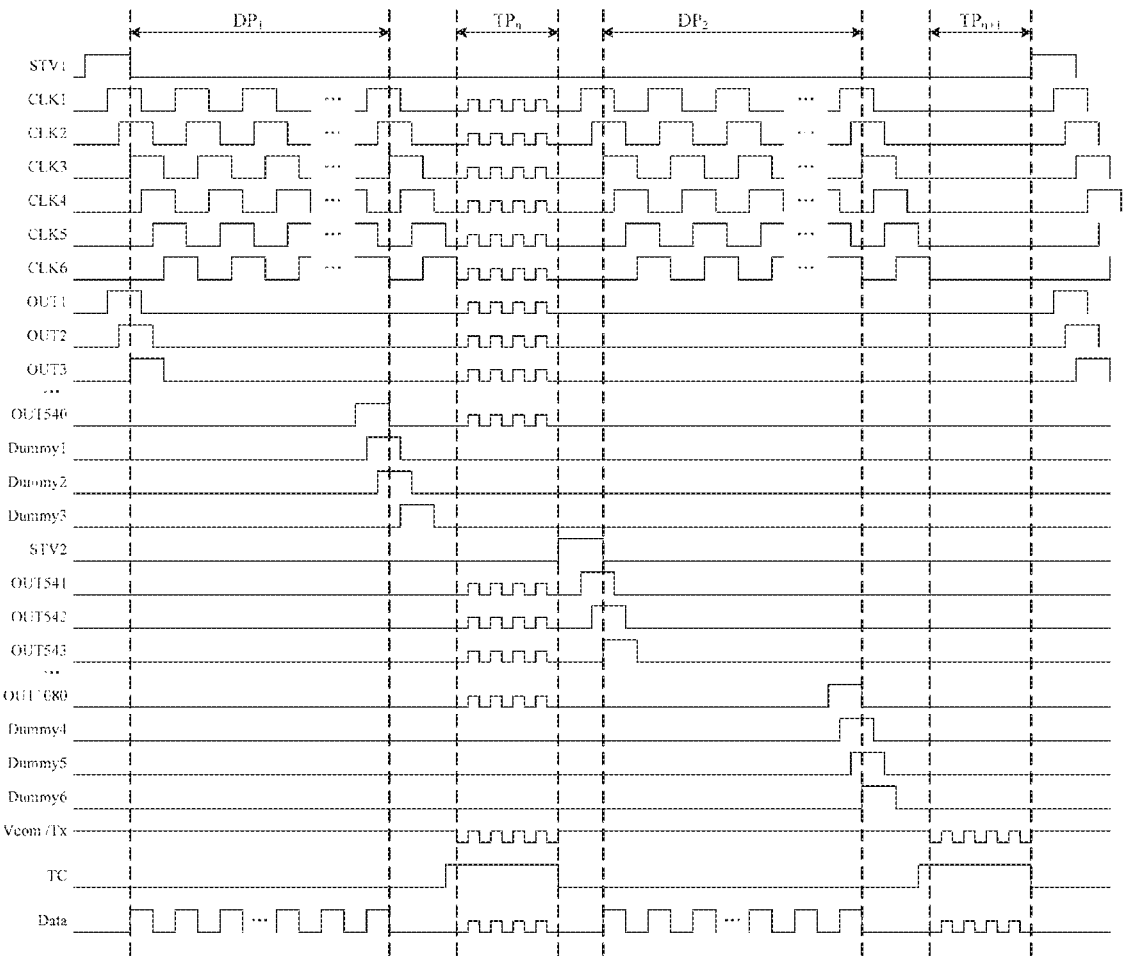
FIG. 10 is a signal timing diagram of the GOA circuit in another exemplary arrangement of the present disclosure.

Based on this, this arrangement may achieve the above-mentioned function through the circuit structure of the shift register unit 400 as shown in FIG. 9. The noise cancelling control signal terminal TC may be connected to a pull-up node (PU) through a unidirectional transistor in the shift register unit 400. When the noise cancelling control signal is at a high level during the touch time period, the pull-up node (PU) is pulled high. The signal output terminal (OUT) outputs the preset signal provided by the clock signal terminal (CLK). It should be noted that the preset signal provided by the clock signal terminal (CLK) during the touch time period should be the same as the touch signal provided by the COM electrode. At the other time periods, the noise cancelling control signals are set at a low level, which may ensure that the shift register unit 400 is not affected during the display time period.

Optionally, referring to FIG. 9, the shift register unit 400 may include an input module 901, a reset module 902, a noise cancelling control module 903, an output module 904, a pull-down control module 905 and a pull-down module 906.

The input module 901 is connected to an input signal terminal (INPUT), a first power signal terminal (VGH), and a pull-up node (PU). The input module 901 is configured to transmit the first power signal to the pull-up node (PU) in response to the input signal. The input module 901 may include, for example, a transistor M1. The transistor M1 may include a control terminal connected to the input signal terminal (INPUT), a first terminal connected to the first power signal terminal (VGH), and a second terminal connected to the pull-up node (PU).

The reset module 902 is connected to the reset signal terminal (RESET), a second power signal terminal (GCL), and the pull-up node (PU), and is configured to transmit the second power signal to the pull-up node (PU) in response to the reset signal. The reset module 902 may include, for example, a transistor M2. The transistor M2 has a control terminal connected to the reset signal terminal (RESET), a first terminal connected to the second power signal terminal (GCL), and a second terminal connected to the pull-up node (PU).

The noise cancelling control module 903 is connected to the noise cancelling control signal terminal TC and the pull-up node (PU), and is configured to transmit the noise cancelling control signal to the pull-up node (PU) in response to the noise cancelling control signal. The noise cancelling control module 903 may include, for example, a transistor M3, and the transistor M3 has a control terminal and a first terminal connected to the noise cancelling control signal terminal (TC), and a second terminal connected to the pull-up node (PU).

The output module 904 is connected to the clock signal terminal (CLK), the pull-up node (PU), and the signal output terminal (OUT), and is configured to transmit the clock signal to the signal output terminal (OUT) in response to a voltage signal of the pull-up node (PU). The output module 904 may include, for example, a transistor M4 and a capacitor C. The transistor M4 has a control terminal connected to the pull-up node (PU), a first terminal connected to the clock signal terminal (CLK), and a second terminal connected to the signal output terminal (OUT); and the capacitor C is connected between the pull-up node (PU) and the signal output terminal (OUT).

The pull-down control module 905 is connected to the first power signal terminal (VGH), the pull-up node (PU), the second power signal terminal (GCL), and a pull-down node (PD), and is configured to transmit the first power signal to the pull-down node (PD) in response to the first power signal, and transmit the second power signal (GCL) to the pull-down node (PD) in response to the voltage signal of the pull-up node (PU). The pull-down control module 905 may include, for example, transistors M5-M8. The transistor M5 may have a control terminal and a first terminal both connected to the first power signal terminal (VGH) and a second terminal connected to a pull-down control node (PD-CN). The transistor M6 may have a control terminal connected to the first power signal terminal (VGH), a first terminal connected to the pull-down control node (PD-CN), and a second terminal connected to the pull-down node (PD). The transistor M7 may have a control terminal connected to the pull-up node (PU), a first terminal connected to the second power signal terminal (GCL), a second terminal connected to the pull-down control node (PD-CN). The transistor M8 may have a control terminal connected to the pull-up node (PU), a first terminal connected to the second power signal terminal (GCL) and a second terminal connect to the pull-down node (PD).

The pull-down module 906 is connected to the pull-down node (PD), the second power signal terminal (GCL), the pull-up node (PU), and the signal output terminal (OUT), and is configured to transmit the second power signal to the pull-up node (PU) and the signal output terminal (OUT) in response to the voltage signal of the pull-down node (PD). The pull-down module 906 may include a transistor M9 and a transistor M10. The transistor M9 may have a control terminal connected to the pull-down node (PD), a first terminal connected to the second power signal terminal (GCL), a second terminal connected to the pull-up node (PU). The transistor M10 may have a control terminal connected to the pull-down node (PD), a first terminal connected to the second power signal terminal (GCL), and a second terminal connected to the signal output terminal (OUT).

It should be noted that each module in the shift register unit 400 may be implemented by different combinations of transistors and capacitors. The circuit structure provided in this arrangement is only exemplary, and other circuit connection relationships may only achieve the aforesaid functions, which all are within the protection scope of the present disclosure.

Referring to FIG. 7 and FIG. 8, as an example of the FHD product (resolution of 1920×1080) of 6 CLK, the GOA circuit includes two GOA sub-circuits 40. The first GOA sub-circuit 40 may include 540 shift register units 400, opening signals are provided by the first start signal (STV1) and are output to the $540^{th}$ output signal (OUT540) from the first output signal (OUT1) in a sequential cascade manner, and the first GOA sub-circuit 40 may be configured to output scan signals in the first to $540^{th}$ rows. The second GOA sub-circuit 40 may also include 540 shift register units 400, and the opening signals are provided by the second start signal (STV2) and are output to the $1080^{th}$ output signal (OUT1080) from the $541^{th}$ output signal (OUT541) in a sequential cascade manner, and the second GOA sub-circuit 40 may be configured to output the scan signals in the $541^{th}$ to $1080^{th}$ rows. There are three dummy shift register units in each of the GOA sub-circuit 40, which are configured to provide reset signals for the last three stages of the shift register unit 400 in the corresponding the GOA sub-circuit 40. The GOA circuit in this arrangement, different from the arrangements in FIG. 4 and FIG. 5, is further connected to a noise cancelling control signal terminal (TC), and is configured to output a noise cancelling control signal in the touch time period such that each shift register unit 400 outputs a preset signal generated by the clock signal terminal (CLK). The preset signal and the touch signal provided by the COM electrode and the data signal provided by the source driving circuit are the same signal.

Based on this, one half display time $DP_1$, a $N^{th}$ touch time $TP_n$, the other half display time $DP_2$, and a $N+1^{th}$ touch time $TP_{(n+1)}$ are included within one frame. FIG. 6 shows a waveform timing diagram of signals. A COM electrode serves as the common electrode in the display time period and the touch electrode in the touch time period, and has a dual function of providing a display voltage and capturing touch signals, so that the COM signal of the COM electrode may provide a DC signal during the display time period and a square wave signal during the touch time period. In addition, both the scan signal and the data signal have the same waveform as the touch signal in the touch time period, which may effectively reduce a parasitic capacitance between a gate line and a data line and the touch electrode, so that influence of the parasitic capacitance on the touch signal will be minimized to ensure the best touch effect. In this arrangement, since the touch signal is acquired twice within one frame, the report rate of the touch signal is twice of the refresh frequency of the displayer, but this arrangement is not limited thereto. If the GOA circuit is divided into three GOA sub-circuits 40 and controlled independently by a separate start signal, the report rate of the touch signal is three times of the refresh frequency of the displayer, and so forth.

In this arrangement, the GOA circuit may also be connected to a TCON (Timing Controller). The TCON may be configured to detect signal variation of two frame screens adjacent to each other corresponding to respective GOA sub-circuits 40, and output a timing control signal to the GOA circuit according to the signal variation. After receiving the timing control signal sent by the TCON, the GOA circuit may output the start signals corresponding to the GOA sub-circuits 40 sequentially in the next frame.

As an example of the GOA circuit including two GOA sub-circuits 40, as shown in FIG. 11, according to a scanning mode of the GOA circuit, the display screen may be divided into upper and lower parts, that is, a first area 111 and a second area 112, the first area 111 may be controlled by the first GOA sub-circuit 40 and is provided with an opening signal by the first start signal (STV1); and the second region 112 may be controlled by the second GOA sub-circuit 40 and is provided with an opening signal by the second start signal (STV2).

Based on this, the scanning mode of the first frame may be, for example, scanning from up to bottom, at this time, the first start signal (STV1) provides an opening signal for the first GOA sub-circuit 40, and a first acquisition of the first touch signal is performed after the first GOA sub-circuit 40 has been output; and then the second start signal (STV2) provides an opening signal for the second GOA sub-circuit 40, and a second acquisition of the second touch signal is performed after the second GOA sub-circuit 40 has been output.

Based on this, the TCON detects the signal variation of the adjacent two frame screens, the signal of the second area 112 changes drastically, and the signal of the first area 111 changes slightly. At this time, when the next frame scan is performed, the second start signal (STV2) is first output to implement the output of the second GOA sub-circuit 40, and then the first acquisition of the touch signal is performed, then the first start signal (STV1) is output to implement output of the first GOA sub-circuit 40, and a second acquisition of the touch signal is performed. From time perspective, as shown in FIG. 12, the second area 112 does not pass through a holding time of the half frame after the previous frame has been charged, but updates the data at the beginning of the next frame, so the refresh frequency of this area is increased, so that the response speed is increased and the display quality of the screen is improved.

In this arrangement, if number of the GOA sub-circuits 40 increases, the display quality of the screen may also be improved by setting many more and more complicated dynamic response adjustment modes such as a forward scanning and a reverse scanning.

This arrangement also provides a gate driving method for driving the aforesaid GOA circuit. The gate driving method may include: providing independent start signals to the respective GOA sub-circuits 40 in sequence so that a plurality of cascaded shift register units 400 in each GOA sub-circuit 40 sequentially output a plurality of rows of scan signals; where the start signals of different GOA sub-circuits 400 are separated by a time interval to perform acquisition of the touch signals.

Referring to FIG. 4 and FIG. 7, as an example of a GOA circuit including two GOA sub-circuits 40, as shown in FIG. 13, the gate driving method may include the steps as follows.

In S1, a first start signal (STV1) is provided to the first GOA sub-circuit such that a plurality of cascaded shift register units 400 in the first GOA sub-circuit sequentially output a plurality of rows of the scan signals.

In S2, a second start signal (STV2) is provided to the second GOA sub-circuit such that a plurality of cascaded shift register units 400 in the second GOA sub-circuit sequentially output a plurality of rows of the scan signals.

The first start signal (STV1) and the second start signal (STV2) are separated from each other by a time interval to perform acquisition of the touch signals.

As an example of the GOA circuit as shown in FIG. 4 and FIG. 5, the exemplary driving timing of the gate driving method may be described as follows: the start signal (STV1) of the first GOA sub-circuit opens a high level to drive shift output of the respective shift register units 400 in the first GOA sub-circuit, all the gate lines after end of the output are kept at a low level, at this time, the touch signal is input to the COM electrode through the source driving circuit and scanning of one frame is completed; after the scanning is finished, the start signal (STV2) of the second GOA sub-circuit opens a high lever to drive shift output of the respective shift register units 400 in the second GOA sub-circuit, and after the output is completed, the touch signal is scanned again and the above process is repeated until wiring-in of the entire frame screen and scanning of the touch signals are completed.

According to the gate driving method provided by the exemplary arrangement of the present disclosure, the plurality of GOA sub-circuits 40 are controlled by using independent start signals such that the output signals of the respective GOA sub-circuits 40 are separated by a certain time period to perform acquisition of the touch signals within the separated time period. In this case, the report rate of the touch signal will be significantly improved with respect to the refresh frequency of the GOA circuit, so that response speed of the touch product is improved.

Based on this, the GOA circuit further includes a noise cancelling control signal terminal (TC). The gate driving method may further include step S3.

In S3, in the touch control phase, a noise cancelling control signal is output to all of the shift register units 400, so that each of the shift register unit 400 outputs a preset signal generated by the clock signal terminal. The preset signal has the same waveform with the touch signal and the data signal.

As a result, both the scan signal and the data signal are configured to have the same waveform as the touch signal in the touch time period such that the pressure difference between the scan signal and the touch signal may be effectively reduced, to reduce noise of the touch signal and ensure the best touch effect.

In this exemplary arrangement, the gate driving method may further include Step S4.

In S4, the signal variation of two adjacent frame screens corresponding to the respective GOA sub-circuits 40 detected by TCON is acquired, and the first start signal (STV1) and the second start signal (STV2) are output in sequence in the next frame according to the signal variations.

As a result, if the TCON detects that the signal of the display area refreshed in the previous frame screen changes drastically and the signal of the display area refreshed firstly changes slightly, the signal of the display area that changes drastically will be refreshed firstly at the beginning of the next frame screen, and then the signal of the display area that changes slightly will be refreshed. Based on this, the scanning sequence and manner of the respective GOA sub-circuits 40 are re-arranged and output according to the signal variation of each frame screen, to increase the refresh frequency of the display area where the signal changes greatly in the front and rear frame, so that the response speed of the screen may be accelerated and the display quality of the screen will be improved.

It should be noted that the scanning sequence in this arrangement may refer to the scanning sequence between different GOA sub-circuits 40, or refer to whether any GOA sub-circuit 40 adopts the forward scanning or the reverse scanning, which will not be limited herein.

It should be noted that the gate driving method has been described in detail in the corresponding gate driving circuit, and will not be described herein.

The exemplary arrangement further provides a GOA display panel including the aforesaid GOA circuit. The GOA circuit and its driving method may improve the report rate of the touch signal while realizing the narrow frame, and may also expand the dynamic display effect of the screen, and may be applied to all GOA display panels.

The display panel may include, for example, any product or component having a display function, such as a mobile phone, a tablet computer, a television, a notebook computer, a digital photo frame, a navigator, which is not specifically limited in the present disclosure.

The person skilled in the art, after consideration of the specification and practice, would easily think of other arrangements of the present disclosure. The present disclosure is directed to cover any variation, use, or adaptive modification, which all comply with the general principle of the present disclosure and include common sense or the customary means in the art. The description and arrangements are merely considered as exemplary examples, and real scope and spirit of the present disclosure are determined by the appended claims.

It should be understood that the present disclosure is not limited to the precise configuration as described above and shown in the drawings, and may be modified and changed without departing from the scope of the protection scope. The scope of the disclosure is determined only by the appended claims.

What is claimed is:

1. A Gate Driver on Array (GOA) circuit, comprising:
    a plurality of GOA sub-circuits,
        wherein each of the GOA sub-circuits comprises:
            a plurality of cascaded shift register units, each one of the GOA sub-circuits is connected to an independent start signal terminal and receives a start signal from the independent start signal terminal used only for the one of the GOA sub-circuits, the respective GOA sub-circuits receive the corresponding start signals that are independent from each other, and the start signals of different ones of the GOA sub-circuits are separated by a time interval for acquisition of touch signals; and
            a plurality of cascaded dummy shift register units connected to ends of the plurality of cascaded shift register units, wherein the dummy shift register units are configured to provide a reset signal for at least one of the plurality of cascaded shift register units at an end of the GOA sub-circuits;
    a plurality of clock signal terminals, wherein a number of the dummy shift register units is equal to one-half of a number of the clock signal terminals; and
    a noise cancelling control signal terminal configured to output a noise cancelling control signal at a touch phase, wherein responsive to the noise cancelling control signal, each of the shift register units outputs a preset signal generated by at least one of the clock signal terminals, and the preset signal has the same waveform with at least one of the touch signals and a data signal.

2. The GOA circuit according to claim 1, wherein the shift register unit comprises:
    an input module that is connected to an input signal terminal, a first power signal terminal and a pull-up node, wherein the input module is configured to transmit the first power signal to the pull-up node in response to an input signal;
    a reset module that is connected to a reset signal terminal, a second power signal terminal, and the pull-up node, wherein the reset module is configured to transmit a second power signal to the pull-up node in response to the reset signal;
    a noise cancelling control module that is connected to the noise cancelling control signal terminal and the pull-up node, wherein the noise cancelling control module is configured to transmit the noise cancelling control signal to the pull-up node in response to the noise cancelling control signal;
    an output module that is connected to at least one of the clock signal terminals, the pull-up node, and a signal output terminal, wherein the output module is configured to transmit a clock signal to the signal output terminal in response to a voltage signal of the pull-up node;
    a pull-down control module that is connected to the first power signal terminal, the pull-up node, the second power signal terminal, and a pull-down node, wherein the pull-down control module is configured to transmit the first power signal to the pull-down node in response to the first power signal, and transmit the second power signal to the pull-down node in response to the voltage signal of the pull-up node;
    a pull-down module that is connected to the pull-down node, the second power signal terminal, the pull-up node, and the signal output terminal, wherein the pull-down module is configured to transmit the second power signal to the pull-up node and the signal output terminal in response to the voltage signal of the pull-down node.

3. The GOA circuit according to claim 1, wherein the GOA circuit is further connected to a timing controller, and is configured to acquire signal variation of adjacent two frame screens corresponding to respective ones of the GOA sub-circuits detected by the timing controller; and the start signals corresponding to the respective GOA sub-circuits are sequentially output in a next frame according to a degree of the signal variation.

4. A gate driving method for driving a Gate Driver on Array (GOA) circuit, wherein the GOA circuit comprises: a plurality of GOA sub-circuits, wherein each of the GOA sub-circuits comprises a plurality of cascaded shift register units, each one of the GOA sub-circuits is connected to an independent start signal terminal and receives a start signal from independent start signal terminal used only for the one of the GOA sub-circuits, the respective GOA sub-circuits receive the corresponding start signals that are independent from each other, and the start signals of different ones of the GOA sub-circuits are separated by a time interval for acquisition of touch signals, wherein each of the GOA sub-circuits further comprises a plurality of cascaded dummy shift register units connected to ends of the plurality of cascaded shift register units, wherein the dummy shift register units are configured to provide a reset signal for at least one of the plurality of cascaded shift register units at an end of the GOA sub-circuits; and wherein the GOA circuit further comprises a plurality of clock signal terminals; and a number of the dummy shift register units is equal to one-half of a number of the clock signal terminals, and the method comprises:
    providing the independent start signal to each one of the GOA sub-circuits in turn such that the plurality of cascaded shift register units in the one of the GOA sub-circuits sequentially output a plurality of rows of scan signals;
    wherein the start signals of different ones of the GOA sub-circuits are separated by the time interval for acquisition of the touch signals, and
    wherein the GOA circuit further comprises a noise cancelling control signal terminal, the gate driving method further comprises:
    in a touch phase, outputting a noise cancelling control signal to all shift register units, responsive to the noise cancelling control signal, each of the shift register units outputs a preset signal generated by a clock signal terminal, wherein the preset signal has the same waveform with at least one of the touch signals and a data signal.

5. The gate driving method according to claim 4, wherein the gate driving method further comprises:

acquiring signal variation of adjacent two frame screens corresponding to the respective GOA sub-circuits detected by a timing controller, and sequentially outputting a first start signal and a second start signal in a next frame according to a degree of the signal variation.

6. A display panel, comprising:

a Gate Driver on Array (GOA) circuit, wherein the GOA circuit comprises:

a plurality of GOA sub-circuits, wherein each of the GOA sub-circuits comprises:

a plurality of cascaded shift register units, each one of the GOA sub-circuits is connected to an independent start signal terminal and receives a start signal from the independent start signal terminal used only for the one of the GOA sub-circuits, the respective GOA sub-circuits receive the corresponding start signals that are independent from each other, and the start signals of different ones of the GOA sub-circuits are separated by a time interval for acquisition of touch signals; and a plurality of cascaded dummy shift register units connected to ends of the plurality of cascaded shift register units, wherein the dummy shift register units are configured to provide a reset signal for at least one of the plurality of cascaded shift register units at an end of the GOA sub-circuits;

a plurality of clock signal terminals, wherein a number of the dummy shift register units is equal to one-half of a number of the clock signal terminals; and a noise cancelling control signal terminal configured to output a noise cancelling control signal at a touch phase, wherein responsive to the noise cancelling control signal, each of the shift register units outputs a preset signal generated by at least one of the clock signal terminals, and the preset signal has the same waveform with at least one of the touch signals and a data signal.

\* \* \* \* \*